US009717169B2

(12) United States Patent
Bodette et al.

(10) Patent No.: US 9,717,169 B2
(45) Date of Patent: Jul. 25, 2017

(54) MITIGATING ELECTROMAGNETIC INTERFERENCE IN A COMPUTING DEVICE

(71) Applicant: LENOVO Enterprise Solutions (Singapore) PTE. LTD., New Tech Park (SG)

(72) Inventors: Edward J. Bodette, Cary, NC (US); Stuart B. Benefield, Durham, NC (US); Michael H. Crowder, Cary, NC (US); Brad E. Dillon, Raleigh, NC (US)

(73) Assignee: LENOVO ENTERPRISE SOLUTIONS (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/867,539

(22) Filed: Sep. 28, 2015

(65) Prior Publication Data
US 2017/0094846 A1 Mar. 30, 2017

(51) Int. Cl.
*H05K 9/00* (2006.01)
*G06F 1/20* (2006.01)
*H05K 7/20* (2006.01)
*G06F 1/16* (2006.01)

(52) U.S. Cl.
CPC ......... *H05K 9/0081* (2013.01); *G06F 1/1656* (2013.01); *G06F 1/20* (2013.01); *G06F 1/203* (2013.01); *H05K 7/20727* (2013.01)

(58) Field of Classification Search
CPC .... G06F 1/182; H05K 9/0032; H05K 9/0039; H05K 1/0218; H05K 9/0016; H05K 9/006

USPC .......................................... 361/799, 816, 818
See application file for complete search history.

(56) References Cited

U.S. PATENT DOCUMENTS

| | | | | |
|---|---|---|---|---|
| 6,011,689 A * | 1/2000 | Wrycraft | ................... | G06F 1/20 361/679.31 |
| 6,031,717 A * | 2/2000 | Baddour | ................... | G06F 1/20 361/679.48 |
| 6,115,250 A * | 9/2000 | Schmitt | ...................... | G06F 1/20 165/104.34 |
| 6,181,557 B1* | 1/2001 | Gatti | .................. | H05K 7/20618 165/122 |
| 6,466,440 B2* | 10/2002 | Kaneko | .................. | B23K 1/008 165/104.33 |
| 6,587,340 B2* | 7/2003 | Grouell | ................ | H05K 7/2019 165/122 |
| 7,345,875 B2* | 3/2008 | Elkins | ................ | H05K 7/20172 361/690 |
| 7,525,709 B2* | 4/2009 | Kimura | ................ | G02B 26/123 347/243 |
| 7,800,902 B2* | 9/2010 | Della Fiora | ........ | H05K 7/20145 361/679.48 |
| 8,007,228 B2* | 8/2011 | Wang | .................. | F04D 25/0613 415/146 |

(Continued)

*Primary Examiner* — Hung S Bui
(74) *Attorney, Agent, or Firm* — Kunzler Law Group; Jason Friday (57) ABSTRACT

Apparatuses, methods, and systems are disclosed for mitigating electromagnetic interference within a computing device. A base unit is coupled to an inside of a computing device. One or more conductive elements are coupled to the base unit. The one or more conductive elements are located within an air flow such that the one or more conductive elements are movable in response to air movement generated by the air flow.

20 Claims, 5 Drawing Sheets

(56) References Cited

U.S. PATENT DOCUMENTS 8,601,740 B2 * 12/2013 Tu .................. H05K 7/20181
                                                               49/87.1
9,438,015 B2 * 9/2016 Arcos .................. H02B 13/025

* cited by examiner

MITIGATING ELECTROMAGNETIC INTERFERENCE IN A COMPUTING DEVICE

FIELD

The subject matter disclosed herein relates to electromagnetic interference and more particularly relates to mitigating electromagnetic interference in a computing device.

BACKGROUND

Electromagnetic frequency emissions can interfere with devices, electrical circuits, data transmissions, etc. The amount of allowed emissions emitted from a device may be determined by government regulations. If the emitted emissions of the devices exceed the allowed limits, the devices may not be allowed to be offered for sale. Current solutions for reducing electromagnetic interference includes adding electromagnetic compatible components to improve electromagnetic shielding, modifying circuit configurations, or adding radio frequency lossy material. However, each of these solutions requires changes that are expensive, have long lead times, and have a limited effective bandwidth.

BRIEF SUMMARY

An apparatus for mitigating electromagnetic interference in a computing device is disclosed. A method and system also perform the functions of the apparatus. In one embodiment, an apparatus includes a base unit that is coupled to an inside of a computing device. In a further embodiment, one or more conductive elements are coupled to the base unit. The one or more conductive elements may be located within an air flow such that the one or more conductive elements are movable in response to air movement generated by the air flow.

In one embodiment, a length of each of the one or more conductive elements corresponds to a lowest frequency desired to be reduced within the computing device. In a further embodiment, each of the one or more conductive elements has a length corresponding to a range of frequencies being emitted within the computing device such that a conductive element that is longer than a different conductive element reduces a larger range of frequencies being emitted than the different conductive element.

In certain embodiments, a plurality of conductive elements are coupled to the base unit. The plurality of conductive elements may include conductive elements of different lengths. In some embodiments, the base unit includes a suspension unit coupled to the computing device at one or more locations. The one or more conductive elements may be coupled to the suspension unit at one or more locations along a length of the suspension unit. The suspension unit, in various embodiments, positions the one or more conductive elements away from a structure of the computing device.

In one embodiment, the base unit with the coupled one or more conductive elements is disposed within the computing device at a location that minimizes interference with the flow of air within the computing device. In another embodiment, at least a portion of the base unit and the one or more conductive elements are made of a single piece of material. In a further embodiment, each of the one or more conductive elements is more rigid near an end that is coupled to the base unit than near an end that is not coupled to the base unit.

In some embodiments, the one or more conductive elements include a conductive layer insulated by a non-conductive layer. In certain embodiments, the one or more conductive elements are electrically connected to the base unit such that a conductive path travels from the base unit to each of the one or more conductive elements. In a further embodiment, the base unit is electrically connected to an enclosure of the computing device such that a conductive path is generated from the enclosure to the base unit.

In one embodiment, the air flow is generated by one or more components of the computing device, the one or more conductive elements being movable without power and without additional fans. In various embodiments, the one or more conductive elements include flexible strips, rotatable blades, and/or flexible panels. In some embodiments, the one or more conductive elements are made from conductive materials including metalized plastic, sheet metal, metal foil, and/or conductive fabric.

A method, in one embodiment, includes providing a base unit including one or more conductive elements coupled to the base unit. The one or more conductive elements may be movable in response to air movement generated by an air flow. In a further embodiment, the method includes coupling the base unit with the one or more conductive elements to an inside of a computing device such that the one or more conductive elements are located within an air flow.

In one embodiment, a length of each of the one or more conductive elements corresponds to a lowest frequency desired to be reduced within the computing device. In certain embodiments, each of the one or more conductive elements has a length corresponding to a range of frequencies being emitted within the computing device such that a conductive element that is longer than a different conductive element reduces a larger range of frequencies being emitted than the different conductive element.

In some embodiments, a plurality of conductive elements are coupled to the base unit. The plurality of conductive elements, in another embodiment, include conductive elements of different lengths. In certain embodiments, the base unit includes a suspension unit coupled to the computing device at one or more locations. The one or more conductive elements may be coupled to the suspension unit at one or more locations along a length of the suspension unit. The suspension unit may position the one or more conductive elements away from a structure of the computing device.

A system, in one embodiment, includes a computing device and a base unit coupled to an inside of a computing device. In a further embodiment, the system includes one or more conductive elements coupled to the base unit. The one or more conductive elements may be located within an air flow such that the one or more conductive elements are movable in response to air movement generated by the air flow.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

As will be appreciated by one skilled in the art, aspects of the embodiments may be embodied as a system, method, or apparatus. Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Aspects of the embodiments are described below with reference to schematic flowchart diagrams and/or schematic block diagrams of methods, apparatuses, and systems according to embodiments. The schematic flowchart diagrams and/or schematic block diagrams in the Figures illustrate the architecture, functionality, and operation of possible implementations of apparatuses, systems, and methods according to various embodiments.

It should be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

Figure 1:
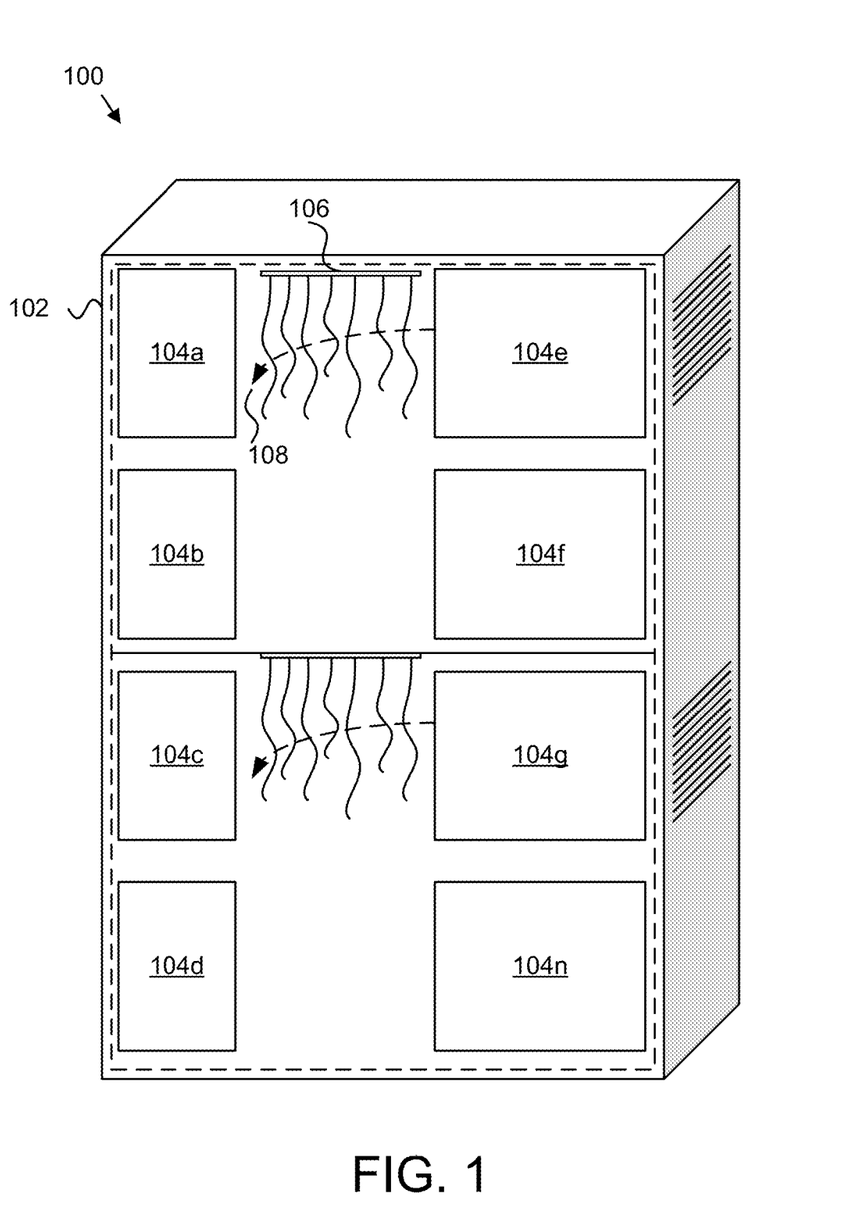
FIG. 1 is a schematic block diagram illustrating one embodiment of a system for mitigating electromagnetic interference in a computing device.

FIG. 1 is a schematic block diagram illustrating one embodiment of a system 100 for mitigating electromagnetic interference in a computing device 102. In one embodiment, the system 100 includes a computing device 102. The computing device 102 may be embodied as a server (e.g., a blade server, a rack-mounted server, a cloud server, a server located in a data center, a network-attached server, etc.), a desktop computer, a laptop computer, a tablet computer, a smart phone, a smart watch or other wearable technology, a television, a set-top box (e.g., a cable or satellite receiver box, a game console, etc.), an audio receiver, a media center, or the like.

The computing device 102, or more particularly, one or more components 104a-n within the computing device 102, may generate electromagnetic radiation and cause electromagnetic interference ("EMI") within the computing device 102. As used herein, electromagnetic interference is a disturbance caused by electromagnetic radiation that may interrupt, obstruct, disturb, or otherwise degrade or limit the effective performance of a circuit. The source of the EMI may be any object that carries rapidly changing electrical currents, such as an electrical circuit. For example, the components 104a-n may include power supplies, network cards, graphics cards, storage devices, memory media, motherboards, processors, and/or the like.

In a further embodiment, the system 100 includes an EMI mitigation apparatus 106, which is further described with reference to FIGS. 2-6. In certain embodiments, electromagnetic and/or radio frequency emissions generated within a computing device 102 may be required to meet a determined emissions level in order to comply with government or other regulations. The EMI mitigation apparatus 106, in one embodiment, is configured to reduce electromagnetic emissions, and consequently reduce the amount of EMI within the computing device 102, by controlling and randomizing electromagnetic resonances/modes within the computing device 102.

As shown in FIGS. 2-6, the EMI mitigation apparatus 106 may include a plurality of conductive elements 204 that move using an air flow 108 that is already present within the computing device 102, e.g., the air flow 108 generated by one or more air movers (e.g., fans) installed within the computing device 102, such as fans for the power supply, the processor, the graphics card, etc. Thus, the EMI mitigation apparatus 106 may be a passive structure in that it does not require power or additional fans to make the conductive elements 204 move. In another embodiment, the conductive elements 204 of the EMI mitigation apparatus 106 move using air flow 108 generated by one or more fans external to the computing device 102, such as fans installed within the area where the computing device 102 is located, and directed towards the computing device 102.

In certain embodiments, as the conductive elements 204 move within the air flow 108, the location of electromagnetic peaks and valleys, also known as standing waves, continuously varies within the computing device 102. Accordingly, the average electromagnetic field at any "hotspot" within the computing device 102 may be reduced, and the corresponding emissions that escape out of the computing device 102 may similarly be reduced. In some embodiments, the EMI mitigation apparatus 106 achieves mode-stirring or mode-mixing, which is used in devices that produce electromagnetic emissions, such as microwaves, to reduce "hot-spots" within the device. In certain embodiments, the EMI mitigation apparatus 106, through the principle of reciprocity, improves the computing device's 102 immunity to external electromagnetic interference.

Figure 2:
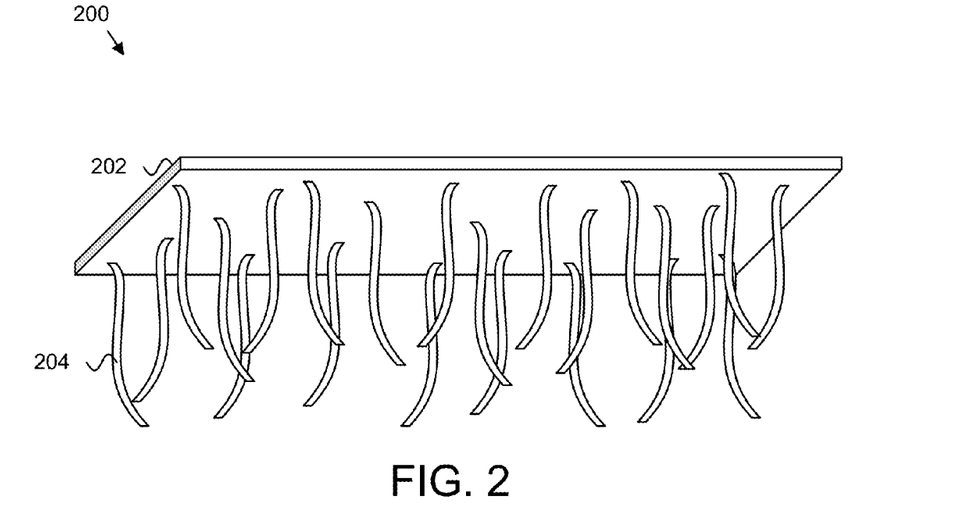
FIG. 2 is a schematic block diagram illustrating one embodiment of an apparatus for mitigating electromagnetic interference in a computing device.

FIG. 2 illustrates one embodiment of an apparatus 200 for mitigating EMI in a computing device 102. In one embodiment, the EMI mitigation apparatus 200 includes a base unit 202 and one or more conductive elements 204. The base unit 202, in certain embodiments, is made of a substantially rigid material, such as metal, plastic, or the like. The base unit 202, as depicted in FIG. 2, has a substantially rectangular or square shape. The base unit 202, in other embodiments, can have various shapes, such as circular, triangular, oval, or any custom shape that may be determined by the space or area where the EMI mitigation apparatus 200 is to be installed within a computing device 102.

In one embodiment, a surface of the base unit 202 includes an adhesive that allows a plurality of conductive elements 204 to be coupled to the base unit 202. For example, the conductive elements 204 may be adhered to the base unit 202 using a thermal adhesive such as glue, paste, tape, etc. In other embodiments, the base unit 202 may include various fasteners on its surface that receive an opposite fastener located on the conductive elements 204 that couple the conductive elements 204 to the base unit 202. For example, the surface of the base unit 202 may include one-half of a hook-and-loop fastener and the conductive elements 204 may include the other half of the hook-and-loop fastener. Similarly, the ends of the conductive elements 204 may include a magnetic component that allows the conductive elements 204 to couple to the base unit 202 using magnetism.

In some embodiments, the base unit 202 may include slots that are configured to receive the conductive elements 204. In such an embodiment, the conductive elements 204 may clip or snap into the slots. In some embodiments, the conductive elements 204 may fit into the slots using a friction fit. In this manner, the conductive elements 204 may be selectively coupled to the base unit 202, and may be configured as desired. One of skill in the art will recognize the myriad ways that a conductive element 204 may be selectively coupled to the base unit 202.

In one embodiment, the conductive elements 204 may be permanently coupled to the base unit 202. For example, the conductive elements 204 may be welded, soldered, or the like to the base unit 202. In a further embodiment, at least a portion of the base unit 202 and the conductive elements 204 are made from a single piece of material, such as a single sheet of metal, metalized film or plastic, or Mylar®, or other similar metalized material.

The base unit 202, in one embodiment, may be coupled to an enclosure of the computing device 102. For example, the base unit 202 may be glued, bonded, soldered, taped, adhered with a magnet, or the like to a side of an enclosure case for a desktop computer. In certain embodiments, the base unit 202 is coupled to the inside of the computing device 102 such that the conductive elements 204 do not touch or contact other components 104a-n within the computing device 102. For example, the base unit 202 may be coupled to a side of the enclosure of the computing device 102 at a location such that the conductive elements 204 will not touch or come in contact with any circuit boards, memory devices, storage devices, processors, etc. within the computing device 102. Otherwise, if the conductive elements 204 were to contact components 104a-n within the computing device 102, the components 104a-n may short circuit or malfunction.

In a further embodiment, the base unit 202 may be disposed within the computing device 102 such that the conductive elements 204 are in an airstream or an air flow 108, which causes the conductive elements 204 to move, wave, sway, etc., with the movement of the air and ultimately reduce the amount of EMI within the computing device 102. In some embodiments, the base unit 202 is disposed within the computing device 102 at a location that minimizes interference with the air flow 108 so that other components 104a-n can still take advantage of the cooling provided by the air flow 108.

In one embodiment, the size of the base unit 202 and/or the number of conductive elements 204 coupled to the base unit 202 may correspond to the size of the computing device 102 where the base unit 202 is installed. For example, an EMI mitigation apparatus 200 installed in a server rack may have a larger base unit 202, and more conductive elements 204, than an EMI mitigation apparatus 200 installed in a tablet computer.

In a further embodiment, the conductive elements 204, as shown in FIG. 2, include strips or lengths of conductive material that absorbs, attracts, or the like, electromagnetic waves generated by the components 104a-n in the computing device 102 and reduces the amount of EMI in the computing device 102. In various embodiments, the conductive material includes flexible conductive material, such as metallized plastic, such as Mylar®, sheet metal, metal foil, conductive fabric, or the like, which allows the conductive elements 204 to move freely, and in a random motion, in an airstream without requiring power or additional fans. In another embodiment, the system 100 and/or apparatus 200 (or other apparatuses described herein 300, 400, 500, 600 may include one or more fans dedicated to moving the conductive elements 204 or may include vanes, air ducts, or other devices to re-direct some air movement to the conductive elements 204.

In certain embodiments, the conductive elements 204 are of varying lengths, thicknesses, widths, or the like, and may include different strips of various materials. In one embodiment, the length of a conductive element 204 corresponds to the lowest frequency desired to be reduced within the computing device 102. In other words, the longer a conductive element 204 is, the more electromagnetic frequencies the conductive element 204 may be able to interfere with. For example, a strip that is 10 cm long will be able to interfere with more frequencies emitted on a lower-end of the frequency spectrum than a strip that is 1 cm long.

Accordingly, the length of a conductive element 204 may correspond to a range of frequencies that are being emitted within the computing device 102 such that a conductive element 204 that is longer than a different conductive element 204 will be able to reduce or interfere with a larger range of electromagnetic frequencies. Going back to the previous example, a conductive strip that is 10 cm long may reduce electromagnetic emissions in the range of 400 MHz to 40 GHz while a conductive strip that is 1 cm long may reduce electromagnetic emissions in the range of 4 GHz to 40 GHz.

In one embodiment, the lowest frequency influenced or interfered with has a wavelength that corresponds to approximately one-eighth of the conductive element's 204 largest dimension. For a 10 cm conductive strip, for example, the lowest frequency may be close to 400 MHz while the lowest frequency for a 1 cm conductive strip may be approximately 4 GHz. In certain embodiments, the upper frequency is only limited to the frequency at which the conductive elements 204 become non-conductive, which may depend on the materials that conductive elements 204 are made of. This may extend well beyond 40 GHz depending on the materials chosen, for example, but a frequency of 40 GHz may be a practical limit beyond which legal EMI measurements are no longer required.

In one embodiment, a conductive element 204 is more rigid at or near the end of the conductive element 204 that couples to the base unit 202 than at the opposite end. In this manner, the less-rigid ends of the conductive elements 204 are flexible enough to randomly move with air flow 108 generated within the computing device 102 while the more rigid ends of the conductive elements 204 allow the conductive elements 204 to stand on end. For example, a conductive element 204 may include a flexible metallized plastic material at an end of the conductive element 204 not coupled to the base unit 202 and a more rigid sheet metal material near the end of the conductive element 204 coupled to the base unit 202.

In a further embodiment, the conductive elements 204 includes a conductive layer insulated by a non-conductive layer. For example, a conductive element 204 may include a conductive layer of sheet metal shrouded in a non-conductive layer of plastic or similar non-conductive material. In this manner, the conductive elements 204 may touch or contact components 104a-n within the computing device 102 without causing a short of malfunction in the component. Accordingly, the base unit 202 may be disposed within computing devices 102 that may not have much open space within its enclosure, such as a smart phone, tablet computer, laptop computer, etc.

In one embodiment, the conductive elements 204 are electrically connected to the base unit 202 such that a conductive path travels from the base unit 202 to each of the one or more conductive elements 204. As used herein, a conductive path is a flow of electricity from a source to a load, in this case from an electrical source within the computing device 102 to the conductive elements 204 and/or the base unit 202. In such an embodiment, the conductive elements 204 may be electrically conductive. In a further embodiment, the base unit 202 may be electrically connected to an enclosure of the computing device 102 such that a conductive path is generated from the enclosure to the base unit 202. The base unit 202, for example, may be electrically connected to the enclosure using conductive adhesives, bolts, rivets, bonding wires, etc.

Figure 3:
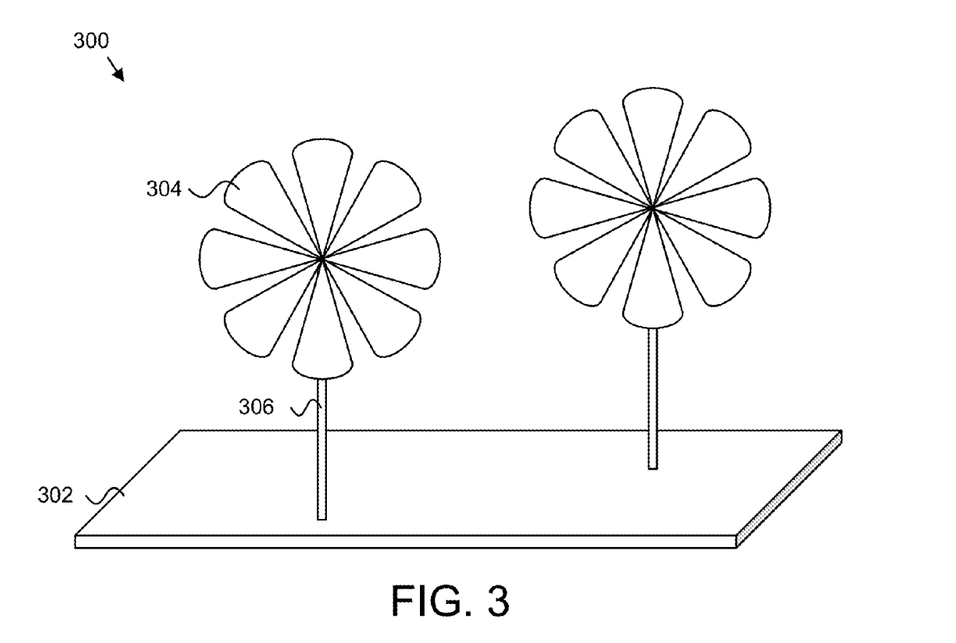
FIG. 3 is a schematic block diagram illustrating one embodiment of another apparatus for mitigating electromagnetic interference in a computing device.

FIG. 3 is a schematic block diagram illustrating one embodiment of another apparatus 300 for mitigating EMI in a computing device 102. In one embodiment, the EMI mitigation apparatus 300 includes a base unit 302, which may be substantially similar to the base unit 202 described above with reference to FIG. 2. The one or more conductive elements 304 may be configured as a pinwheel structure situated upon a shaft 306 that is coupled to the base unit 302.

The conductive elements 304 that are part of the pinwheel structure may be substantially similar to the conductive elements 204 of FIG. 2. For example, the conductive elements 304 may be flexible enough to move with air movement, but also rigid enough to rotate around the shaft 306 in response to the air movement. In this manner, the conductive elements 304 provide random movement in multiple directions to mitigate the EMI within the computing device 102.

The size and/or number of the pinwheel structures may be determined as a function of the size of the computing device 102 and/or the size of the space within the computing device 102 where the pinwheel structures are installed. For example, a server rack may have space large enough for five pinwheel structures that each have a six-inch diameter, whereas a desktop computer may only have space for two pinwheel structures that each have a three-inch diameter. Similarly, the number and size of conductive elements 304 may vary and may depend on the desired size of the pinwheel structure and the range of electromagnetic frequencies that are desired to be reduced within the computing device 102. For example, the length of the conductive elements 304 may correspond to the range of electromagnetic frequencies that are desired to be interfered with, which would ultimately determine the size of the pinwheel structure.

Figure 4:
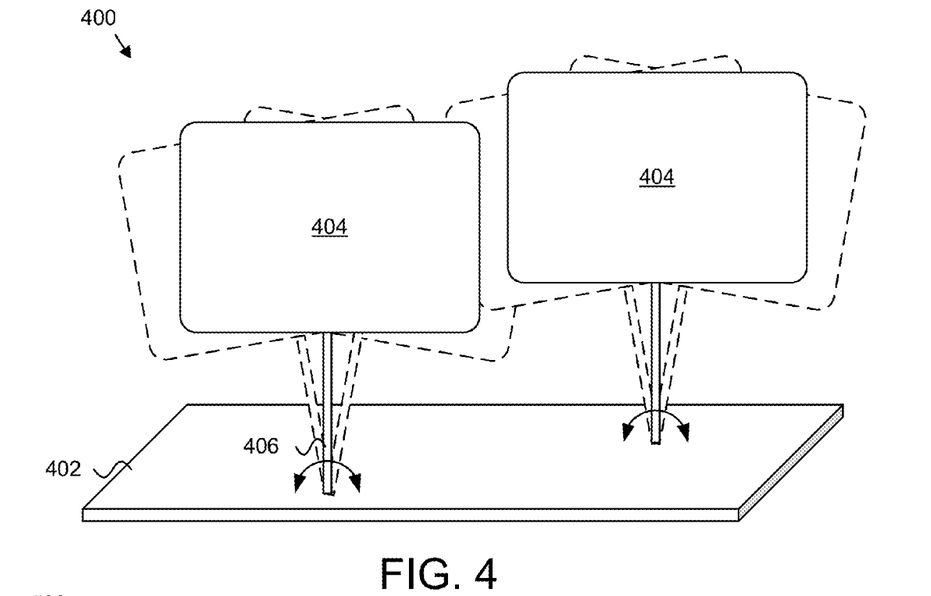
FIG. 4 is a schematic block diagram illustrating one embodiment of yet another apparatus for mitigating electromagnetic interference in a computing device.

FIG. 4 is a schematic block diagram illustrating one embodiment of another apparatus 400 for mitigating EMI in a computing device 102. In one embodiment, the EMI mitigation apparatus 400 includes a base unit 402, which may be substantially similar to the base unit 202 described above with reference to FIG. 2. The one or more conductive elements 404 may be configured as panels coupled to a shaft 406 that is coupled to the base unit 402. The conductive panels 404 may be substantially similar to the conductive elements 204 of FIG. 2 in the sense that the conductive elements 304 are flexible enough to move with air movement to reduce EMI within the computing device 102. Moreover, the shafts 406 that the conductive panels 404 are coupled to may be attached to a pivoting element in the base unit 402 such that the shafts 406 can move side-to-side, back-and-forth, or in a full 360° circular motion. In this manner, the conductive panels 404 provide random movement in multiple directions to mitigate the EMI within the computing device 102.

The size and/or number of the conductive panels 404 may be determined as a function of the size of the computing device 102 and/or the size of the space within the computing device 102 where the conductive panels 404 are installed. For example, a server rack may have space large enough for five conductive panels 404 that each have dimensions of 4"×5", whereas a desktop computer may only have space for two conductive panels 404 that each have dimensions of 2"×3". Similarly, the number and size of conductive panels 404 may depend on the range of electromagnetic frequencies that are desired to be reduced within the computing device 102. For example, the length of the conductive panels 404 may correspond to the range of electromagnetic frequencies that are desired to be interfered with. In other embodiments, one or more conductive elements (e.g. 204, 304, 504, 604) that are different than the conductive elements 404 depicted may be connected to the base unit 402 via a shaft 406 to extend the conductive elements (e.g. 204, 304, 404, 504, 604) into an airstream.

Figure 5:
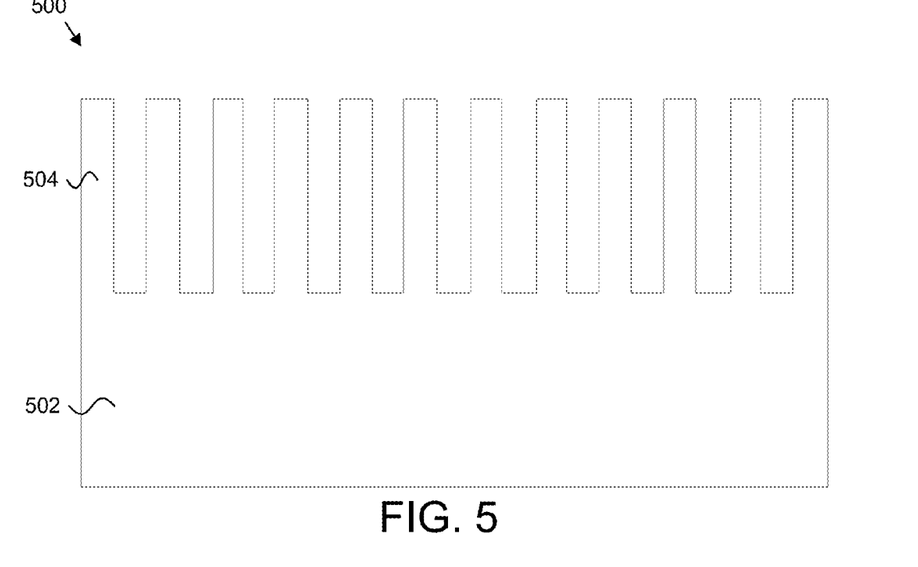
FIG. 5 is a schematic block diagram illustrating one embodiment of an apparatus for mitigating electromagnetic interference in a computing device.

FIG. 5 is a schematic block diagram illustrating one embodiment of an apparatus 500 for mitigating EMI in a computing device 102. In one embodiment, the apparatus 500 is embodied as a base unit 502 with one or more conductive elements 504 coupled to the base unit 502. In some embodiments, the base unit 502 and the conductive elements 504 are made from a single piece of material. For example, the apparatus 500 may be manufactured from a single piece of sheet metal or metallized plastic where the conductive elements 504 are strips cut out of the single piece of material. In one embodiment the conductive elements 504 are separated by gaps. In another embodiment, the conductive elements 504 are adjacent and are formed by a cut in the material forming the apparatus 500 to separate two conductive elements 504. In one embodiment, the conductive elements 504 each have a same length. In another embodiment, lengths of the conductive elements 504 of the apparatus 500 vary. As with the apparatuses described above with reference to FIGS. 2-4, the conductive elements 504 of FIG. 5 may be flexible such that the conductive elements 504 move with air movement within the computing device 102.

In one embodiment, the base unit 502 and/or the conductive elements 504 have different sizes, shapes, widths, thicknesses, heights, etc., which may be based on the size of the space where the apparatus 500 is to be installed, the range of electromagnetic frequencies that are desired to be reduced within the computing device 102, or the like. For example, longer conductive elements 504 may interfere with a larger range of electromagnetic frequencies than shorter conductive elements 504. As described above, the length of the conductive elements 504 may correspond to the lowest electromagnetic frequency that is desired to be interfered with. In a further embodiment, the conductive elements 504 may have various lengths, dimensions, shapes, etc.

Figure 6:
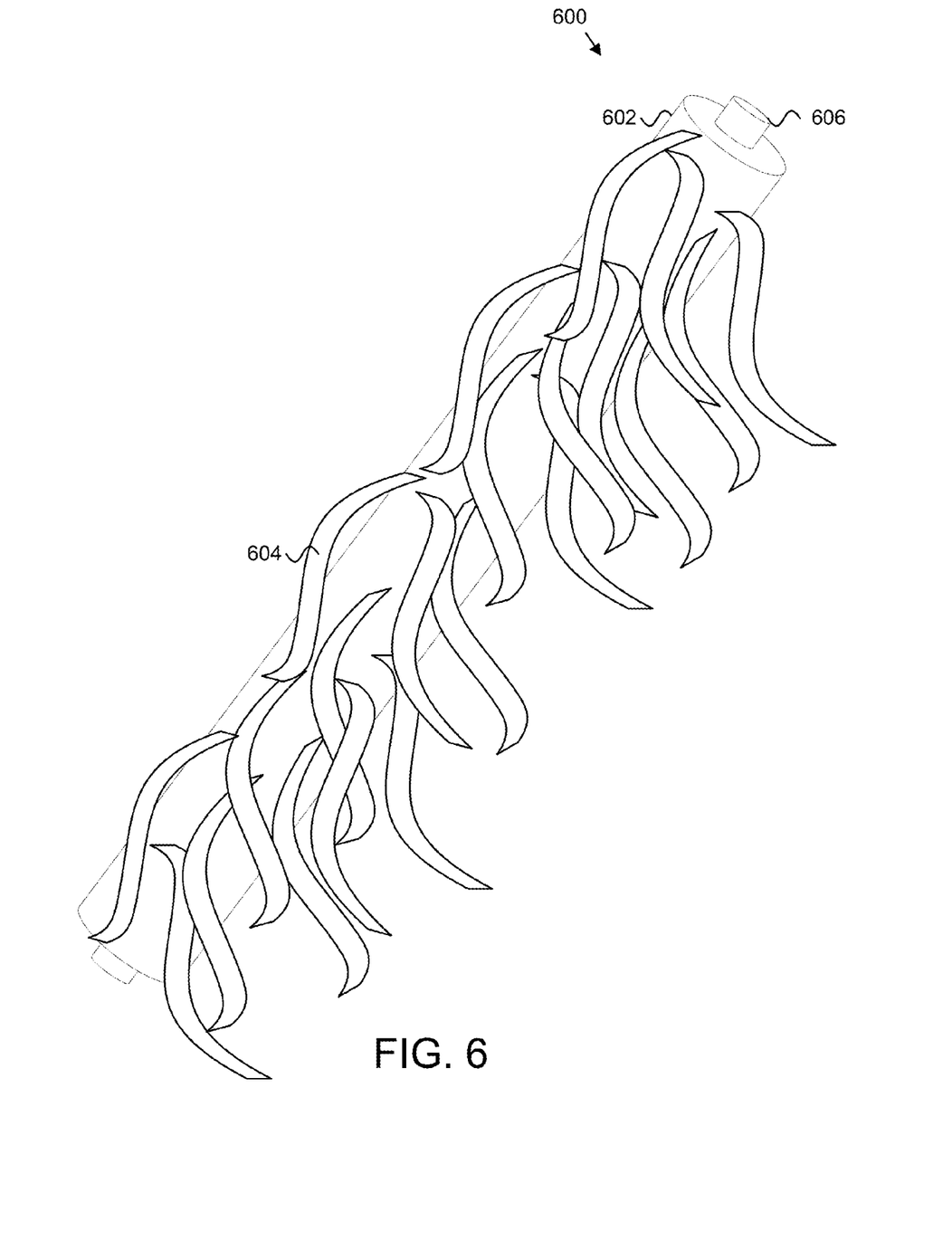
FIG. 6 is a schematic block diagram illustrating one embodiment of an apparatus for mitigating electromagnetic interference in a computing device.

FIG. 6 is a schematic block diagram illustrating one embodiment of an apparatus 600 for mitigating EMI in a computing device 102. In one embodiment, the apparatus 600 includes a base unit 602 embodied as a bar, wire, shaft, rod, or the like. The base unit 602 may have a plurality of conductive elements 604 attached around and along the length of the base unit 602. The base unit 602 may be a suspension unit such that the base unit 602 can be installed in a computing device 102 in a location where it is suspended within the computing device 102.

For example, the base unit 602 may include knobs 606 at each end of the base unit 602 that can be disposed within corresponding grooves, slots, holes, openings, etc. within the computing device 102 so that the base unit 602 can suspend within the computing device 102 and the conductive elements 604 can hang from the base unit 602 and move with air movement within the computing device 102. Because the conductive elements 604 are coupled along and around the base unit 602, EMI can be reduced within the computing device 102 regardless the orientation of the computing device 102. For example, the base unit 602 may be installed in a tablet computer in a suspended position such that at least a portion of the conductive elements 604 move with air movement within the tablet computer regardless the orientation of the tablet computer. In other embodiments, other designs may be used to extend the base unit 602 and/or conductive elements 604 into an air stream in a way that does not interfere with other components of the computing device 102. While several designs are described in the apparatuses 200, 300, 400, 500, 600 depicted in FIGS. 2-6, other designs that include a base unit and conductive elements are anticipated and one of skill in the art will recognize other designs that place conductive elements within an airstream of a computing device 102 to reduce EMI.

Figure 7:
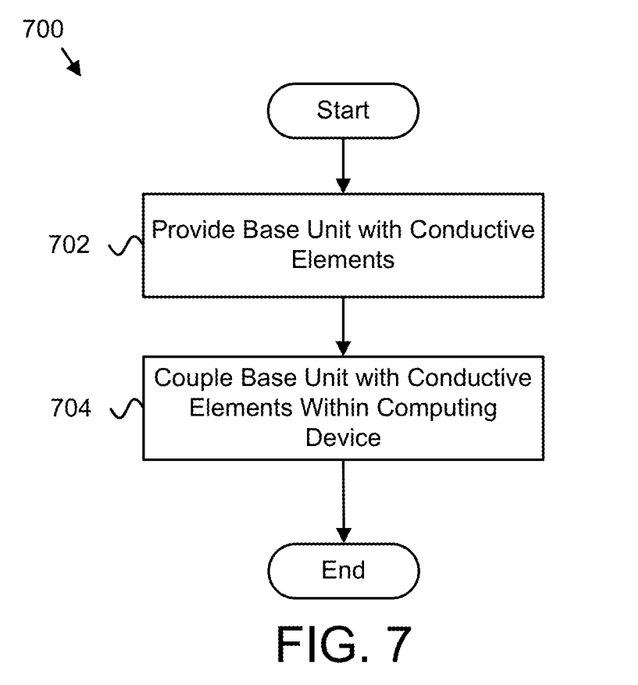
FIG. 7 is a schematic flow chart diagram illustrating one embodiment of a method for mitigating electromagnetic interference in a computing device.

FIG. 7 is a schematic flow chart diagram illustrating one embodiment of a method 700 for mitigating EMI in a computing device 102. In one embodiment, the method 700 begins and provides 702 a base unit 202 including one or more conductive elements 204 coupled to the base unit 202. The method 700, in a further embodiment, couples 704 the base unit 202 with the one or more conductive elements 204 to an inside of a computing device 102 such that the one or more conductive elements 204 are located within an air flow 108 and move with air movement generated by the air flow 108, and the method 700 ends. In a further embodiment, the method 700 includes adding one or more additional fans, air ducts, vanes, etc. to the computing device 102 to provide air flow across the conductive elements 202. Note that while elements of the apparatus 200 of FIG. 2 are described in relation to the method 700 of FIG. 7, the method 700 is equally applicable to the other apparatuses 300, 400, 500, 600 described herein.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An apparatus comprising:
    a base unit coupled to an inside of a computing device; and
    one or more conductive elements coupled to the base unit, the one or more conductive elements made of a flexible conductive material that randomly moves while coupled to the base unit in response to air movement generated by an air flow.

2. The apparatus of claim 1, wherein a length of each of the one or more conductive elements corresponds to a lowest frequency desired to be reduced within the computing device.

3. The apparatus of claim 1, wherein each of the one or more conductive elements has a length corresponding to a range of frequencies being emitted within the computing device such that a conductive element that is longer than a different conductive element reduces a larger range of frequencies being emitted than the different conductive element.

4. The apparatus of claim 1, wherein a plurality of conductive elements are coupled to the base unit, and wherein the plurality of conductive elements comprise conductive elements of different lengths.

5. The apparatus of claim 1, wherein the base unit comprises a suspension unit coupled to the computing device at one or more locations, the one or more conductive elements coupled to the suspension unit at one or more locations along a length of the suspension unit, the suspension unit positioning the one or more conductive elements away from a structure of the computing device.

6. The apparatus of claim 1, wherein the base unit with the coupled one or more conductive elements is disposed within the computing device at a location that minimizes interference with the flow of air within the computing device.

7. The apparatus of claim 1, wherein at least a portion of the base unit and the one or more conductive elements are made of a single piece of material.

8. The apparatus of claim 1, wherein each of the one or more conductive elements is more rigid near an end that is coupled to the base unit than near an end that is not coupled to the base unit.

9. The apparatus of claim 1, wherein the one or more conductive elements comprises a conductive layer insulated by a non-conductive layer.

10. The apparatus of claim 1, wherein the one or more conductive elements are electrically connected to the base unit such that a conductive path travels from the base unit to each of the one or more conductive elements.

11. The apparatus of claim 10, wherein the base unit is electrically connected to an enclosure of the computing device such that a conductive path is generated from the enclosure to the base unit.

12. The apparatus of claim 1, wherein the air flow is generated by one or more components of the computing device, the one or more conductive elements being movable without power and without additional fans.

13. The apparatus of claim 1, wherein the one or more conductive elements comprise one or more of:
flexible strips;
rotatable blades; and
flexible panels.

14. The apparatus of claim 1, wherein the one or more conductive elements are made from conductive materials comprising one or more of:
metalized plastic;
sheet metal;
metal foil; and
conductive fabric.

15. A method comprising:
providing a base unit comprising one or more conductive elements coupled to the base unit, the one or more conductive elements made of a flexible conductive material that randomly moves while coupled to the base unit in response to air movement generated by an air flow; and
coupling the base unit with the one or more conductive elements to an inside of a computing device such that the one or more conductive elements are located within the air flow.

16. The method of claim 15, wherein a length of each of the one or more conductive elements corresponds to a lowest frequency desired to be reduced within the computing device.

17. The method of claim 15, wherein each of the one or more conductive elements has a length corresponding to a range of frequencies being emitted within the computing device such that a conductive element that is longer than a different conductive element reduces a larger range of frequencies being emitted than the different conductive element.

18. The method of claim 15, wherein a plurality of conductive elements are coupled to the base unit, and wherein the plurality of conductive elements comprise conductive elements of different lengths.

19. The method of claim 15, wherein the base unit comprises a suspension unit coupled to the computing device at one or more locations, the one or more conductive elements coupled to the suspension unit at one or more locations along a length of the suspension unit, the suspension unit positioning the one or more conductive elements away from a structure of the computing device.

20. A system comprising:
a computing device;
a base unit coupled to an inside of the computing device; and
one or more conductive elements coupled to the base unit, the one or more conductive elements made of a flexible conductive material that randomly moves while coupled to the base unit in response to air movement generated by an air flow.

* * * * *